US012610575B2

(12) United States Patent
Samkharadze et al.

(10) Patent No.: US 12,610,575 B2
(45) Date of Patent: Apr. 21, 2026

(54) ACCUMULATION GATE FOR QUANTUM DEVICE

(71) Applicants: Nederlandse Organisatie voor toegepast-natuurwetenschappelijk onderzoek TNO, 's-Gravenhage (NL); Technische Universiteit Delft, Delft (NL)

(72) Inventors: Nodar Samkharadze, Delft (NL); Guoji Zheng, Hillsboro, OR (US)

(73) Assignees: Nederlandse Organisatie voor toegepast-natuurwetenschappelijk onderzoek TNO, 's-Gravenhage (NL); Technische Universiteit Delft, Delft (NL)

( * ) Notice: Subject to any disclaimer, the term of this patent is extended or adjusted under 35 U.S.C. 154(b) by 401 days.

(21) Appl. No.: 18/285,836

(22) PCT Filed: Apr. 8, 2022

(86) PCT No.: PCT/NL2022/050196
§ 371 (c)(1),
(2) Date: Oct. 5, 2023

(87) PCT Pub. No.: WO2022/216156
PCT Pub. Date: Oct. 13, 2022

(65) Prior Publication Data
US 2024/0204089 A1 Jun. 20, 2024

(30) Foreign Application Priority Data
Apr. 9, 2021 (EP) ..................................... 21167610

(51) Int. Cl.
H10D 30/47 (2025.01)
B82Y 10/00 (2011.01)
(Continued)

(52) U.S. Cl.
CPC ......... H10D 30/473 (2025.01); H10D 30/014 (2025.01); H10D 48/383 (2025.01);
(Continued)

(58) Field of Classification Search
CPC ...... H10D 64/23; H10D 64/27; H10D 30/473; H10D 30/474; H10D 30/014; H10D 48/383; H10D 48/3835; B82Y 10/00
See application file for complete search history.

(56) References Cited

U.S. PATENT DOCUMENTS

| | | | |
|---|---|---|---|
| 9,886,668 B2 | 2/2018 | Dzurak et al. | |
| 10,929,769 B2 | 2/2021 | Pioro-Ladriere et al. | |

(Continued)

FOREIGN PATENT DOCUMENTS

| | | |
|---|---|---|
| EP | 3772756 A1 | 2/2021 |
| WO | WO 2019/135770 A1 | 7/2019 |

OTHER PUBLICATIONS

European Patent Office, International Search Report in corresponding International Application No. PCT/NL2022/050196, dated Jul. 14, 2022 (3 pages).

(Continued)

*Primary Examiner* — Jose R Diaz
(74) *Attorney, Agent, or Firm* — Leydig, Voit & Mayer, Ltd.

(57) ABSTRACT

A quantum device is described that includes a substrate with a layered structure, e.g. heterostructure, forming a quantum well layer. A doped region is connected to the layered structure for exchanging charge carriers with the quantum well layer. A patterned layer of electrically conductive material forms a set of gates including an accumulation gate. The accumulation gate comprises an accumulation pad configured to accumulate a two-dimensional charge carrier gas (2DCCG) in an active region of the quantum well layer (Continued)

connected there below to the doped region. At least part of an electric pathway between the accumulation pad and a connection pad is narrowed to form a nanoscale constriction for cutting off the active region of the quantum well layer.

15 Claims, 4 Drawing Sheets

(51) Int. Cl.

| | |
|---|---|
| *H10D 30/01* | (2025.01) |
| *H10D 48/00* | (2025.01) |
| *H10D 62/10* | (2025.01) |
| *H10D 62/13* | (2025.01) |
| *H10D 62/83* | (2025.01) |
| *H10D 64/20* | (2025.01) |
| *H10D 64/23* | (2025.01) |
| *H10D 64/27* | (2025.01) |

(52) U.S. Cl.
CPC ....... *H10D 48/3835* (2025.01); *H10D 62/126* (2025.01); *H10D 62/13* (2025.01); *H10D 62/83* (2025.01); *H10D 64/205* (2025.01); *H10D 64/23* (2025.01); *H10D 64/27* (2025.01); *B82Y 10/00* (2013.01)

(56) References Cited

U.S. PATENT DOCUMENTS

| | | | | |
|---|---|---|---|---|
| 11,367,786 | B1 * | 6/2022 | Pan ........................ | H10D 64/62 |
| 2015/0279981 | A1 | 10/2015 | Eriksson et al. | |
| 2017/0243983 | A1 * | 8/2017 | Segev ................. | H03K 17/002 |

OTHER PUBLICATIONS

Paul C Spruijtenburg et al., "A Fabrication Guide for Planar Silicon Quantum dot Heterostructures," Nanotechnology, vol. 29, No. 14, p. 143001 (2018) XP020325918.

* cited by examiner

ACCUMULATION GATE FOR QUANTUM DEVICE

CROSS-REFERENCE TO RELATED APPLICATIONS

This patent application is a U.S. National Phase of PCT International Application No. PCT/NL2022/050196, filed Apr. 8, 2022, which claims priority to European Application No. 21167610.1, filed Apr. 9, 2021, which are both expressly incorporated by reference in their entireties, including any references contained therein.

TECHNICAL FIELD AND BACKGROUND

The present disclosure relates to quantum devices for processing quantum bits, also referred to a "qubits". For example, the processing may include storing, measuring and/or manipulating the qubits. The present disclosure particularly relates to improvements in the manufacturing of various gate structures in such devices, more particularly accumulation gates.

As background, WO 2021/025558 A1 describes a semiconductor element for providing a source reservoir for a charge sensor of a quantum dot device. The element comprises a semiconductor heterostructure including a quantum well layer contiguous to a semiconductor functional layer, one or more ohmic contacts for providing charge carriers, and a first accumulation gate electrode located opposite the quantum well layer and spaced apart therefrom at least by the semiconductor functional layer for enabling to form a two dimensional charge carrier gas in a first area of the quantum well layer upon applying a first biasing voltage to the first accumulation gate electrode. The device further comprises a second accumulation gate electrode opposite the quantum well layer and electrically isolated from the first accumulation gate electrode, the second accumulation gate electrode enabling to be biased with a second biasing voltage, for enabling to extend the two dimensional charge carrier gas in a second area contiguous to the first area.

As known in the art, a quantum well layer is a thin layer configured to confine (quasi-) particles (typically electrons or holes) in a dimension perpendicular to the layer surface, whereas the movement in the other dimensions is essentially unrestricted (at least with regards quantization behavior). For example, the quantum well is formed by a potential well having only discrete energy values. One model used to demonstrate a quantum well is to confine particles, which were initially free to move in three dimensions, to two dimensions, by forcing them to occupy a planar region. A typical quantum well system comprises a thin layer of one type of semiconductor material between two layers of another semiconductor material (e.g. with a larger bandgap). At the interface between two layers or regions of dissimilar material (e.g. different bandgap), a heterojunction can be formed. The combination of multiple heterojunctions together in a device is typically referred to as a heterostructure. Also other types of quantum well system can be envisaged.

In accumulation-mode quantum devices, a two-dimensional charge carrier gas (2DCCG), e.g. 2D electron or hole gas, can be accumulated in a respective region of the quantum well layer by applying a voltage to a nearby accumulation gate, e.g. above said region. The 2DCCG can be isolated from the accumulation gate with a nonconductive layer there between. In accumulation mode devices, the quantum well layer may be essentially without (mobile)

charge carriers until an electric field (caused by the voltage) is applied to attract the charge carriers (e.g. positive voltage to accumulate electrons). So the 2DCCG may be exclusively present where it is accumulated. For example, the charge carriers can be pulled in from conductive regions of the semiconductor, which can be created by locally doping the semiconductor, e.g. by ion implantation or metal diffusion. These doped regions can provide galvanic connection to the 2DCCG. This is also referred to as "ohmics".

For various reasons, it may be desired to limit the area of the 2DCCG connected to the ohmics, which is also referred to as the "2DCCG active area". For example, for some applications, it can be desired to prevent leakage between the accumulation gate and 2DCCG active area because of bonding to the accumulation gate. For other or further applications, it can be desired to reduce leakage between the accumulation gate and 2DCCG active area by reducing the effective area where this leakage may take place. For other or further applications, it can be desired to limit the capacitance between the accumulation gate and 2DCCG active area, relevant for high frequency applications.

One method to limit the 2DCCG active area may include etching away parts of the underlying heterostructure. For example, the etch may define the edge of 2DCCG active area. Another method to limit the 2DCCG active area may include routing part of the accumulation gate on top of a thick dielectric. For example, the thick dielectric may prevent accumulation underneath it, defining the edge of 2DCCG active area. Another method to limit the 2DCCG active area may include routing part of the accumulation gate on top of a second electrode. The second electrode underneath the part of the accumulation gate may locally screen the electric field from the accumulation gate, defining the edge of 2DCCG active area.

Unfortunately known methods of limiting the 2DCCG active area may substantially complicate the fabrication of the quantum device.

SUMMARY

These and other issues can be alleviated in a quantum device as described herein. Typically, the quantum device comprises a substrate with a layered structure forming a quantum well layer at or below an interface of the substrate. A doped region can be connected to the layered structure for exchanging charge carriers with the quantum well layer, e.g. supplying and/or accepting the charge carriers. The quantum devices can be operated by means of a set of gates. Preferably, the gates are formed at or above the interface of the substrate. For example, the gates are formed by a patterned layer of electrically conductive material disposed on top of the substrate. Typically the quantum device includes at least one accumulation gate, and possible other types of gates. Each accumulation gate can be provided with an accumulation pad. In general, the accumulation pad is configured to accumulate a two-dimensional charge carrier gas, 2DCCG, in the quantum well layer there below. This can be used to define an active region of the quantum well layer connected to the doped region. The active region may depend on an electric field generated below the accumulation pad. To connect an electrode to the accumulation gate, the gate can be provided with a connection pad, also referred to as bonding pad. For example, the connection can be used to set an accumulation gate voltage to the accumulation pad via an external electrode. This voltage may determine the electric field generated below in the quantum well layer.

The accumulation pad and the connection pad are typically connected via an electric pathway there between, e.g. to carry the voltage from the electrode to the accumulation pad. As described herein, the electric pathway can be locally narrowed to form a nanoscale constriction for cutting off the active region of the quantum well layer below. By making the nanoscale constriction relatively narrow, e.g. compared to the accumulation pad and/or the rest of the electric pathway, the 2DCCG active area may be confined to the region of the quantum well layer below the accumulation pad (which exchanges charge carriers with the connected doped region). For example, the nanoscale constriction may have limited capacitance to the quantum well underneath, e.g. only being able to accumulate a small amount of charges directly underneath, insufficient amount to form a conductive channel. So, any electric field generated by the small amount of charge below the nanoscale constriction may be negligible, at least sufficiently small that the 2DCCG substantially does not extend through the quantum well layer below the nanoscale constriction, or forms only a minimal passage. Accordingly the 2DCCG active area can be kept relatively small, e.g. extending from the accumulation pad only up to but not beyond the nanoscale constriction towards the connection pad. As will be appreciated, the separation of the 2DCCG active area from the rest can be effected by a nanoscale restriction formed in the same thin film layer as the accumulation gates. Since this does not require additional fabrication steps besides the layer that defines the accumulation gates, production can be simplified. Furthermore, the quantum device according to the present teachings may provide a more uniform topography on the sample, which can help improve reliability and manufacturability, especially when the number of thin film layers would increase.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
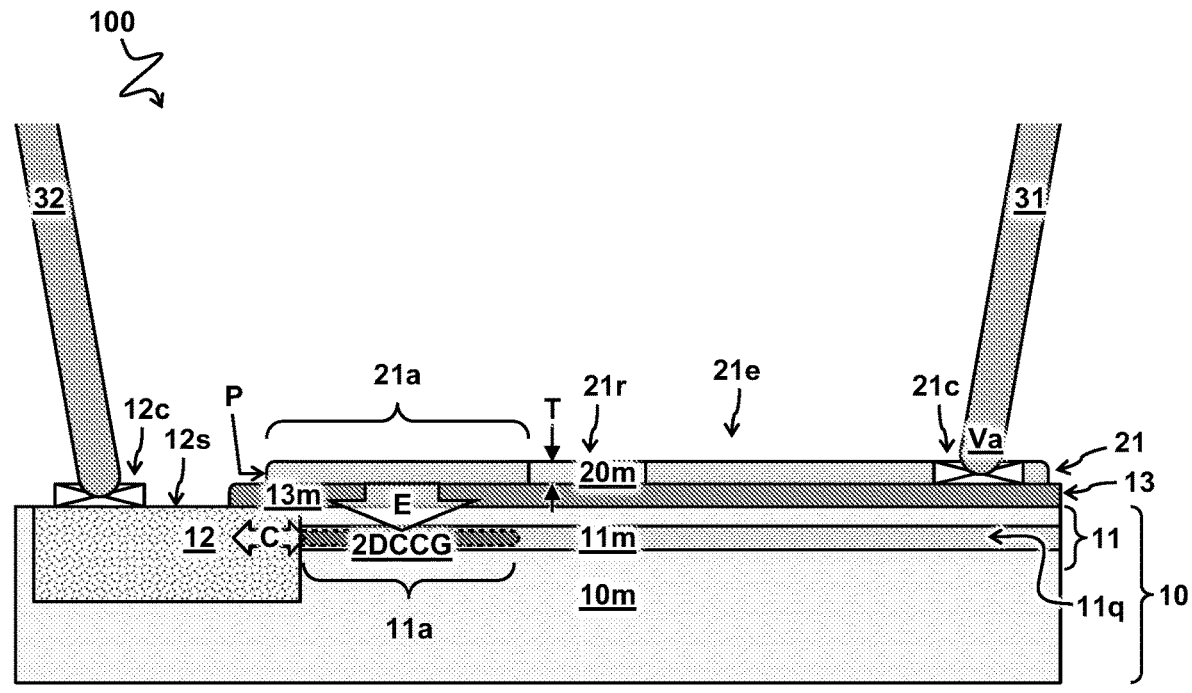
FIGS. 1A and 1B illustrate a cross-section view and plan view, respectively, of an accumulation gate as part of a quantum device.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
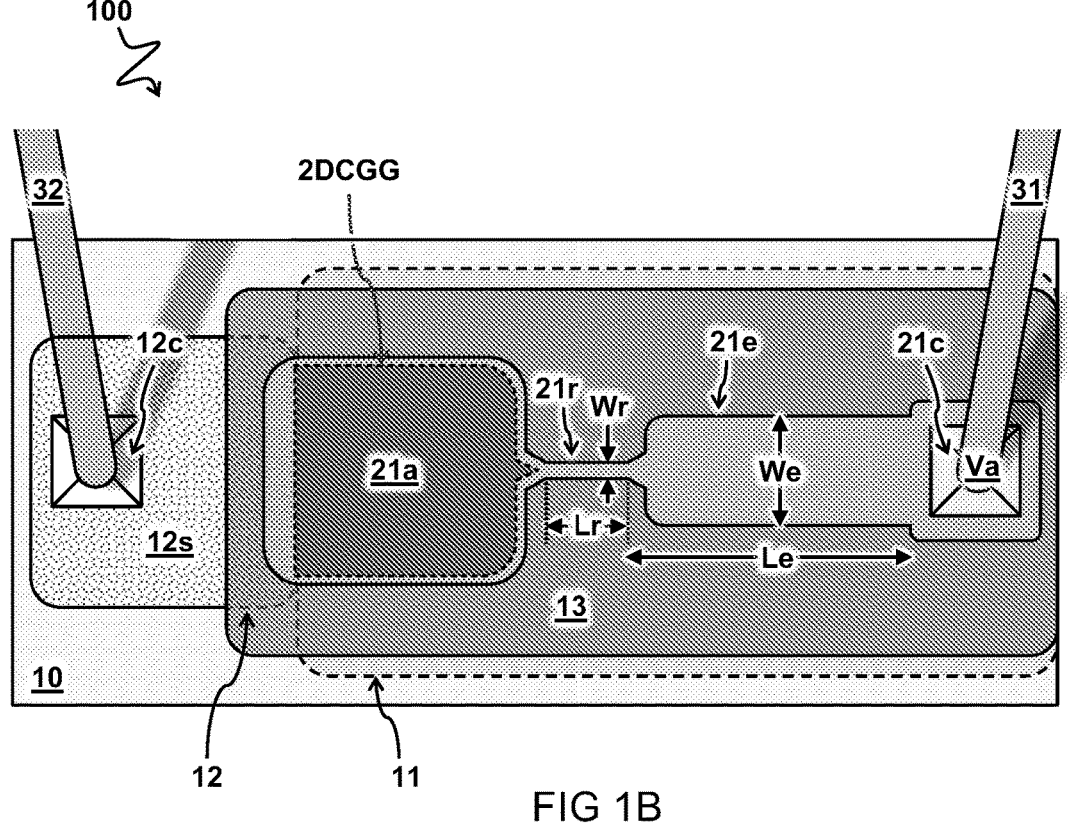

FIGS. 1A and 1B illustrate a cross-section view and plan view, respectively, of an accumulation gate $21$ as part of a quantum device $100$. In some embodiments, the quantum device $100$ comprising a quantum well layer $11q$. Preferably, quantum well layer $11q$ is formed at or below an interface of the substrate $10$. Typically, the quantum well layer $11q$ is formed by a layered structure $11$ that can be part of the substrate $10$. In a preferred embodiment, the quantum well layer $11q$ is formed by a heterostructure. In principle, the quantum well layer can also be formed other types of layered structures. For example, a quantum well layer can also be formed at a $Si/SiO_2$ interface in a silicon substrate with $SiO_2$ dielectric on top. Preferably, a doped region $12$ is connected to the layered structure $11$, e.g. heterostructure, for exchanging charge carriers "C" with the quantum well layer $11q$. For example, the doped region $12$ can be used for supplying and/or accepting the charge carriers "C" to/from the quantum well layer $11q$.

In some embodiments, a patterned layer of electrically conductive material $20m$ is disposed on or inside the substrate to forming a set of gates. Preferably, the electrically conductive material $20m$ is provided at or above the interface of the substrate $11$. In a preferred embodiment, the set of gates comprises one or more one accumulation gates $21$ as described herein. In one embodiment, an accumulation pad $21a$ is configured to accumulate, there below, a two-dimensional charge carrier gas, 2DCCG. This may define an active region $11a$ of the quantum well layer $11q$ connected to the doped region $12$ which can depend on an electric field "E" generated below the accumulation pad $21a$. In another or further embodiment, a connection pad $21c$ is configured to connect a first electrode $31$ to the accumulation gate $21$. For example, this can be used for setting an accumulation gate voltage "Va" to the accumulation pad $21a$ determining the generated electric field "E".

Typically, the accumulation pad $21a$ is connected to the connection pad $21c$ via an electric pathway $21e$ there between. It will be noted that the component sizes in the present figure are schematic, while the typical scale is better illustrated in FIG. 4 (described later). For example, the connection pad $21c$ is typically much larger than the accumulation pad $21a$ so there is sufficient surface for connecting a first electrode $31$ to the accumulation gate $21$. Furthermore, the electric pathway 21e can be relatively long compared to the size of the accumulation pad 21a since the electrodes of other gates have to be fitted to respective connection pads.

Preferably, at least part of the electric pathway 21e of the accumulation gate 21 is narrowed to form a nanoscale constriction 21r for cutting off the active region 11a of the quantum well layer 11q below. Accordingly, nanoscale constriction 21r may help to confine the 2DCCG. In particular the 2DCCG below the accumulation pad 21a may be confined to the active region 11a which is cut off by the nanoscale constriction 21r. Most preferably, the nanoscale constriction 21r is integrally formed as part of the patterned layer 20 of electrically conductive material 20m. For example, the accumulation pad 21a, the nanoscale constriction 21r, and the rest of the electric pathway 21e are formed as part of one layer of the electrically conductive material 20m. As shown, e.g. in FIG. 1B, the nanoscale constriction 21r is preferably a lateral constriction or in-plane narrowing of the conductive layer or pathway. Alternatively, or additionally, it can also be envisaged that a height or thickness of the conductive layer is locally constricted. For example, the electrically conductive material 20m can having locally reduced width and/or thickness at the nanoscale constriction 21r compared to the rest of the electric pathway 21e.

In some embodiments, the whole patterned layer 20 of electrically conductive material 20m is formed as one layer. This may be distinguished e.g. from solutions which rely on routing part of the accumulation gate on top of a second electrode underneath the part of the accumulation gate to locally screen the electric field from the accumulation gate, defining the edge of 2DCCG active area. So the production of the patterned layer 20 can be simplified. Also the connection pad 21c can be formed as part of said one layer. Part of the connection pad 21c can also be formed in another step. For example, the nanoscale constriction 21r is created by depositing and/or etching the patterned layer 20 in the same step as creating other parts of the layer such as the accumulation pad 21a, connection pad 21c, and/or the rest of the electric pathway 21e there between.

In some embodiments, the nanoscale constriction 21r lies in plane (indicated in the figure by "P") with the accumulation pad 21a forming part of the same patterned layer 20. In other words, there are substantially no height differences between the nanoscale constriction 21r and the accumulation pad 21a. This may be distinguished e.g. from solutions which rely on routing part of the accumulation gate on top of a thick dielectric, i.e. lifting part of the conductive material layer to define the edge of 2DCCG active area. Most preferably all parts of the accumulation gate 21 including the rest of the electric pathway 21e and/or connection pad 21c lie in the same plane "P". So the production of the overall stack can be simplified. This can also simplify production of quantum devices comprising a further stack of material layers (e.g. another patterned layer 20 of electrically conductive material 20m). Alternatively, or additionally, the present teachings can also provide benefit in multilayer gate designs. For example, barrier gates can be on a second layer, separated from the first layer of plunger gates by a dielectric layer.

In some embodiments, the quantum well layer 11q extends at least partially below the electric pathway 21e. For example, the quantum well layer 11q may extend over a relatively large area, e.g. extending all the way to the connection pad 21c or even the whole substrate 10. This may be distinguished e.g. from solutions which rely on etching away parts of the underlying heterostructure, or other layered structure, to define the edge of 2DCCG active area. So the production of the layered structure 11 can be simplified.

In a preferred embodiment, the nanoscale constriction 21r, along at least part of the electric pathway 21e between the accumulation pad 21a and connection pad 21c, has a minimum length "Lr", of at least one hundred nanometer, at least one micrometer, at least ten micrometer, e.g. up to one hundred micrometer, or more. Most preferably, along said minimum length "Lr", the nanoscale constriction 21r has a maximum width "Wr" (transverse to the length "Lr" and in plane of the patterned layer 20), less than one hundred nanometer, preferably less than fifty nanometer, e.g. between ten and thirty nanometer, or less. The preferred width may also depend on electrical properties of the substrate, e.g. narrow enough not to have a conductive channel form under 21r for the typical operating voltages for 21a. Typically, the nanoscale constriction 21r has a thickness T less than its maximum width "Wr". For example, the thickness T is less than one hundred nanometer, preferably less than fifty nanometer, e.g. between ten and thirty nanometer, or less. In some embodiments, the thickness T of the nanoscale constriction 21r corresponds to the layer thickness of the electrically conductive material 20m forming the patterned layer 20. For example, this thickness T can be substantially similar or essentially the same for the whole patterned layer 20.

In some embodiments, a length of the electric pathway 21e between the accumulation pad 21a and connection pad 21c is divided in a first length "Lr" of the nanoscale constriction 21r and a second length "Le" of a rest of the electric pathway 21e (e.g. up to the connection pad 21c). Preferably, the second length "Le" is longer than the first length "Lr" by at least a factor ten, hundred, thousand, ten thousand, hundred thousand, million, or more. Most preferably, along said second length "Le", the rest of the electric pathway 21e has a minimum width We, transverse to the second length "Lr", that is larger than a maximum width "Wr" of the nanoscale constriction 21r (along and transverse to said first lenght Lr) by at least a factor five, preferably at least a factor ten, hundred, five hundred, or more. For example, the nanoscale constriction 21r has a first length "Lr" of several micrometers with a maximum width "Wr" of less than fifty nanometer, while the rest of the electric pathway 21e up to the connection pad 21c has a second length "Le" of more than one millimeters which a minimum width of at least one micrometer. Typically, each of the electric pathways need to have a certain length to allow accessing respective connection pads with a macroscopic size electrode. In principle, the whole electric pathway 21e can be relatively narrow forming a long nanoscale constriction 21r. However, this may not be necessary. By making the rest of the electric pathway 21e relatively wide, the chance of breaking a connection can be substantially lowered.

In some embodiments, the nanoscale constriction 21r is disposed along the electric pathway 21e within a distance from the accumulation pad 21a less than one hundred micrometer, preferably less than ten micrometer, more preferably, less than one hundred nanometer. Most preferably, the nanoscale constriction 21r is disposed directly adjacent an area of the accumulation pad 21a, with the rest of the electric pathway 21e between the nanoscale constriction 21r and the connection pad 21c. The closer the nanoscale constriction 21r is to the accumulation pad 21a, the better the 2DCCG active area can be restricted to the active region 11a below the accumulation pad 21a.

In some embodiments, the accumulation pad 21a (up to the nanoscale constriction 21r) has a surface area of at least one tenth square micrometer ($\geq 0.1$ $\mu m^2$), preferably at least one square micrometer, at least ten square micrometer, at least one hundred square micrometer, e.g. up to one thousand square micrometer, ten thousand square micrometer, or more. For example, a certain area may be needed to accumulate sufficient charge carriers "C" to form the 2DCCG, and keep the noisy implanted area sufficiently far away, e.g. from the quantum dots, whereas the maximum active area should still be limited.

In some embodiments, an electrically insulating layer 13 is disposed at least between the electrically conductive material 20$m$ and the quantum well layer 11$q$ (so the quantum well layer 11$q$ is not in direct electrically conductive contact with the electrically conductive material 20$m$). Preferably, the electrically insulating layer 13 is formed by a layer of electrically insulating material 13$m$ deposited on top of the substrate 10. For example, the electrically insulating material 13$m$ comprises or essentially consists of non-conductive material, e.g. an oxide such as AlOx. Also other or further materials can be used. Alternatively, or in addition, an electrically insulating layer can be formed as part of the substrate, e.g. by oxidizing a top layer of a semiconductor substrate.

In some embodiments, the accumulation pad 21$a$ (partially) overlaps an edge of the doped region 12 there below with the electrically insulating layer 13 there between (so the accumulation pad 21$a$ is not in direct electrically conductive contact with the doped region 12). For example, the electrically conductive material 20$m$ forming the accumulation pad 21$a$ and doped material 12$m$ forming the doped region 12 is separated by electrically insulating material 13$m$ forming the electrically insulating layer 13.

In other or further embodiments, at least part of the doped region 12 is exposed, e.g. without the electrically insulating layer 13, to form a galvanic contact 12$c$ for connecting a second electrode 32 with the quantum well layer 11$q$ via the doped region 12. While the present embodiment illustrates the second electrode 32 directly connecting to the doped region 12, of course this can also be connected via intermediate electrically conductive structures. For example, the patterned layer 20 may include an electric track (not shown here) which at one end contacts the doped region 12 and at the other end forms or connects to a connection pad for connecting the second electrode 32. In one embodiment, the second electrode 32 can be used to measure a current of charge carriers exchanged between the doped region 12 and the quantum well layer 11$q$ (e.g. as described later with reference to FIG. 3).

In some embodiments, the quantum well layer 11$q$ comprises or essentially consists of a first material, wherein the quantum well layer 11$q$ is stacked on top of a bottom layer comprising or essentially consisting of a second material, wherein the second material is different from the first material. In one embodiment, the bottom layer is formed by the bulk material 10$m$ of the substrate. For example, the quantum well layer is formed by a thin layer of the first material 11$m$ deposited on top of the substrate. The quantum well layer 11$q$ can also be stacked between a top layer and a bottom layer. For example, the top layer can be formed of the same material as the bottom layer, or another material, e.g. both having a wider band gap than the quantum well layer 11$q$. Typically, the conduction band of the quantum well layer 11$q$ is lower than that of surrounding layers (for devices using negative charge carriers, typically electrons) and/or the valence band of the quantum well layer 11$q$ is higher than that of surrounding layers (for devices using positive charge carriers, typically holes). Alternatively, or additionally, the top layer can also be formed by the electrically insulating layer 13, or the electrically insulating layer can be stacked on top of the top layer. Also other known or yet to be developed structures for creating quantum well layers can be used.

Typically, the quantum well layer 11$q$ has a layer thickness between 0.1-100 nm, preferably between 1-50 nm, most preferably between 5-20 nm. For example, the thickness may be comparable to the "de Broglie" wavelength of the charge carriers "C", e.g. electrons or holes. For example, the thickness may be small enough for the material 11$m$ to fit the crystallographic structure of 10$m$, and not relax into its preferred ground state, thus creating dislocations, or in some other way compromise the quality of the 2DCCG.

In some embodiments, the substrate 10 is a semiconductor substrate. For example, the substrate 10 comprises or essentially consists of a semiconductor material 10$m$, preferably comprising Silicon and/or Germanium. In one embodiment, the layered structure 11 comprises a stack of two or more different material layers, e.g. two or more different semiconductor materials. In a preferred embodiment, the quantum well layer 11$q$ is formed of a first semiconductor material stacked on top of a bottom layer formed of a second semiconductor material. Typically, the second semiconductor material has a wider band gap than the first semiconductor material. Accordingly, the charge carriers may be bounded to the first semiconductor material. The requirement that each material be a semiconductor with unequal band gaps is somewhat loose, especially on small length scales, where electronic properties depend on spatial properties. In principle, a heterojunction can be formed at the interface between various types of two solid-state materials, including crystalline and amorphous structures of metallic, insulating, fast ion conductor and semiconducting materials. For example, the electronic states can also be modified if a quantum well is subject to strain, e.g. be caused by a slight lattice mismatch.

Figures 2A, 2B:
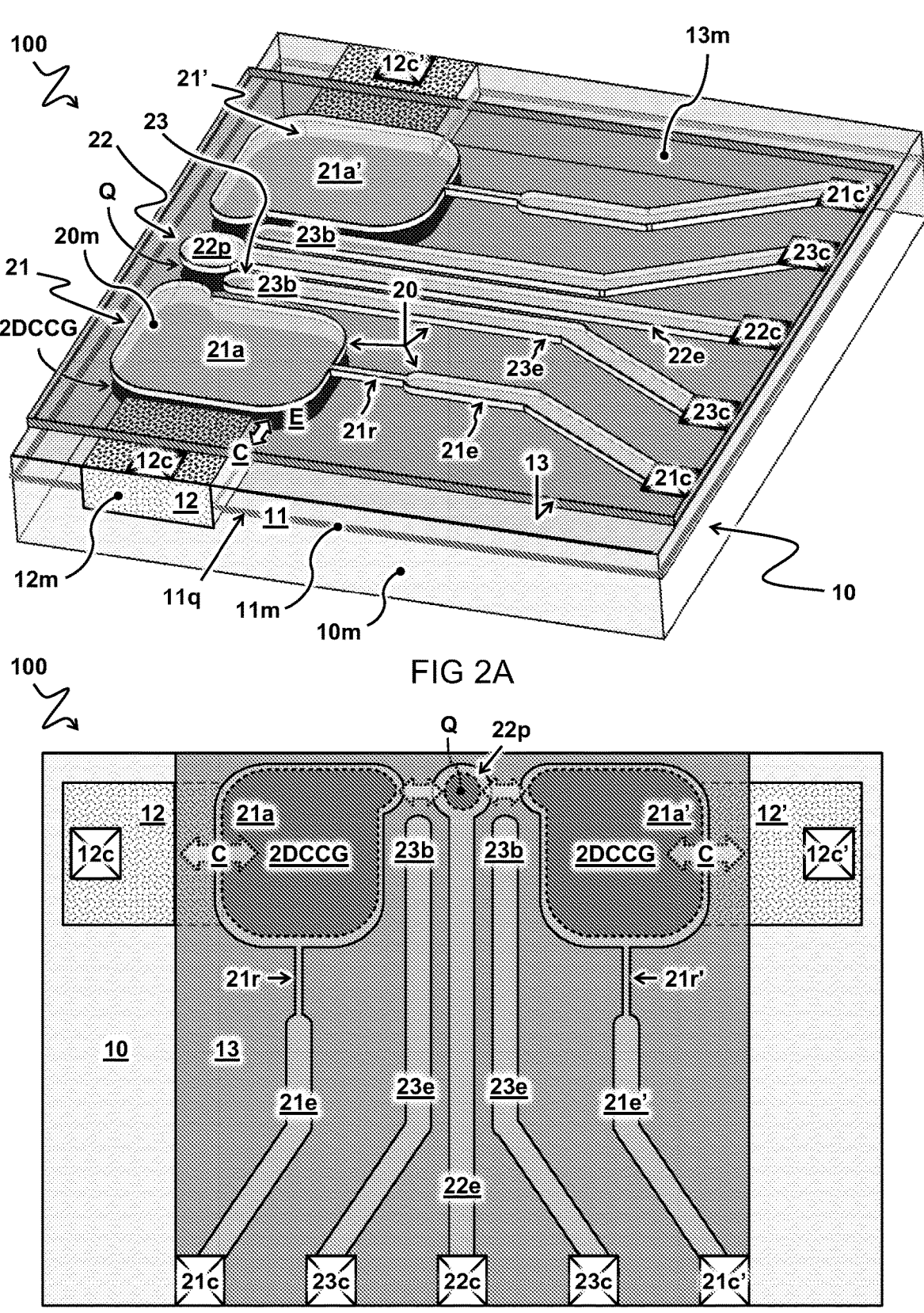
FIGS. 2A and 2B illustrate a perspective translucent view and plan view, respectively, of a quantum device including further gate structures.

FIGS. 2A and 2B illustrate a perspective translucent view and plan view, respectively, of an example quantum device 100 including further gate structures 21,22,23.

In some embodiments, the quantum device 100 comprises one or more plunger gates 22 (only one shown here). For example, each plunger gate 22 comprises a plunger pad 22$p$ configured to form a respective quantum dot "Q" in the quantum well layer 11$q$ there below. Typically, the quantum dot "Q" is formed by confining one or more charge carriers in all three dimensions. For example, a spin state of the charge carrier can be used to represent a quantum bit. In one embodiment, the plunger pad 22$p$ is disposed adjacent the accumulation pad 21$a$ (with a separation there between). For example, the plunger gate 22 is configured to receive a charge carrier in the quantum dot "Q" from the adjacent 2DCCG (which is below the accumulation pad 21$a$). Preferably, the quantum dot "Q" is formed as part of the quantum well layer 11$q$ which may be undoped so the charge carrier can only be received from the 2DCCG. For example, the quantum dot may be formed by applying a plunger voltage to the plunger pad 22$p$ which creates a small region there below which can hold a single charge carrier. For example, the plunger voltage is applied to a connection pad 22$c$ of the plunger gate 22 which is connected to the plunger pad 22$p$ via an electric pathway 22$e$ there between.

In some embodiments, the quantum device 100 comprises one or more barrier gates 23. For example, a barrier pad 23$b$ is disposed between a respective accumulation pad 21$a$ and plunger gate 22$p$. The barrier pad 23$b$ can be configured to generate a second electric field in the quantum well layer 11$q$ below. For example, the second electric field may have a polarity opposite to a respective electric field generated by the accumulation pad 21*a* and/or plunger pad 22*p*.

In some embodiments, the quantum device 100 comprises at least a first accumulation gate 21 and a second accumulation gate 21'. Typically, the first and second accumulations gates 21,21' are disposed on opposite sides of a plunger gate 22, with optional barrier gates 23,23' there between. For example, the first accumulation gate 21 is configured to supply a charge carrier from the 2DCCG to the quantum dot "Q" below the plunger gate 22 and the second accumulation gate 21' is used to receive the charge carrier from the quantum dot "Q" to its own 2DCCG there below. There can also be more than one plunger gate between a set of accumulations gates, e.g. passing a charge carrier between a set of quantum dots there between. In some embodiments, the resistance of the electrical path between the 2DCCG reservoirs through the quantum dot "Q", can be used as a sensitive probe of its electrostatic environment. For example, this can be used to read out states of nearby qubits.

In some embodiments, each accumulation gate 21,21' in the quantum device 100 is provided with a respective nanoscale constriction as described herein. For example, both accumulations gates 21,21' are connected to a respective connection pad 21*c*,21*c*' via a respective nanoscale constriction 21*r*,21*r*' along their respective electric pathway 21*e* there between. Alternatively, it can be envisaged that only some of the accumulation gates are connected via a respective nanoscale constriction, e.g. ones that have high frequency signals applied to them. For example, this may be the case if the nanoscale constriction is only used as a way to limit the capacitance, and the leakage issue is resolved in some other way. Also other types of gates can be connected via a nanoscale constriction, although this is mostly useful for gates affected by leakage and capacitance issues, e.g. gates where accumulating voltages are applied, and/or gates where a high frequency signal is applied.

Figure 3:
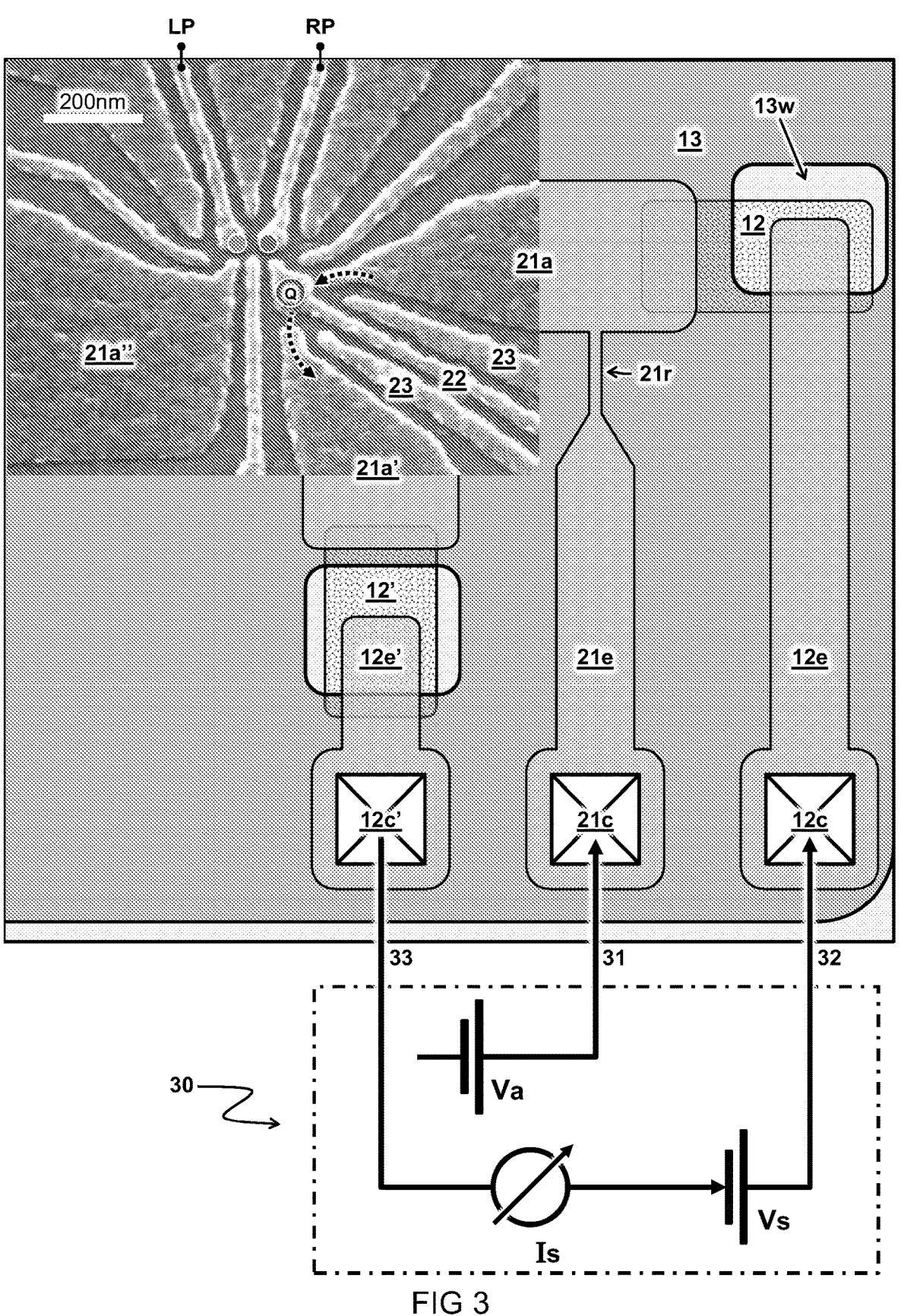
FIG. 3 illustrates on the top left an image of various gate structures, and in the rest of the figure a schematic layout how a set of accumulation pads may be connected for measuring a quantum dot.

FIG. 3 illustrates (on the top left an image) of various gate structures, and (in the rest of the figure) a schematic layout how a set of accumulation pads 21*a*,21*a*' may be connected for measuring a quantum dot Q". In some embodiments, the quantum device 100 comprises or couples to a controller 30 connected via a set of electrodes 31,32,33 to respective connection pads 21*c*, 12*c*, 12*c*' of the set of gates 21,22,23. In one embodiment, the controller 30 is configured to apply an accumulation voltage "Va" via the first electrode 31 to the connection pad 21*c* of the accumulation gate 21 for generating the 2DCCG below the accumulation pad 21*a*. In another or further embodiment, the controller 30 is configured to apply a sensing voltage "Vs" via a second electrode 32 connected to the doped region 12. In another or further embodiment, the controller 30 is connected via a third electrode 33 to a second doped region 12' of a second accumulation gate 21' and configured to measure a sensing current Is passing through the quantum well layer 11*q*, e.g. via the quantum dot "Q".

Also other methods of readout and/or manipulation of quantum dots can be used, e.g. radio frequency RF reflectometry using charge sensing as described in the earlier publication WO 2021/025558 A1. Of course the controller 30 may also be connected to one or more of the other gates as shown in the image. For example, the controller 30 may be further configured to a respective plunger voltage of one or more plunger gates 22; and/or configured to control respective barrier voltages of the barrier gates 23. For example, the quantum device 100 is configured to hold and/or manipulate a set of quantum dots via respective plunger gates LP,RP while a nearby sensing dot "Q" is used to measure a respective spin state of one or more of the set of quantum dots.

Aspects of the present disclosure can also be embodied as methods for processing a quantum bit, e.g. using a quantum device 100 as described herein. In one embodiment, a first voltage "Va" is applied via the first electrode 31 to the connection pad 21*c* of the accumulation gate 21 for generating a 2DCCG below the accumulation pad 21*a*. In another or further embodiment, a second voltage "Vs" is applied via a second electrode 32 connected to the doped region 12 for causing exchange of charge carriers "C" between the doped region 12 and the 2DCCG. For example, one or more of the charge carriers are passed through or adjacent a quantum dot "Q" forming the quantum bit. For example, the quantum bit is processed and/or controlled by reading out and/or manipulating a respective spin state using said charge carriers "C".

Figure 4A:
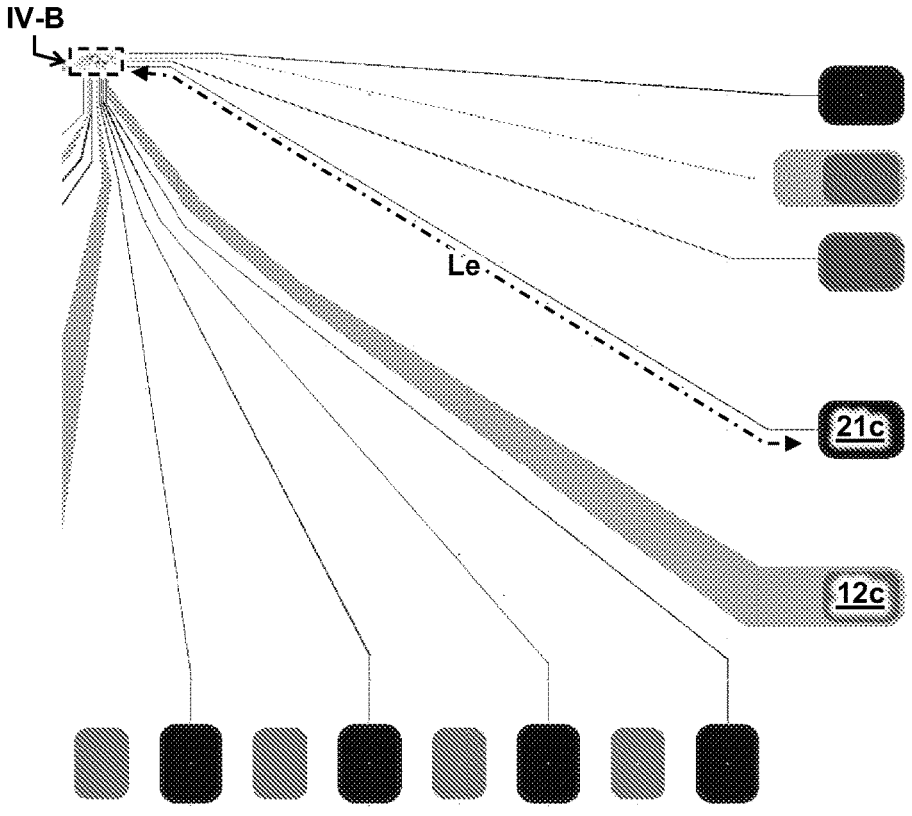
FIG. 4A illustrates an example layout including various connection pads.
Figure 4B:
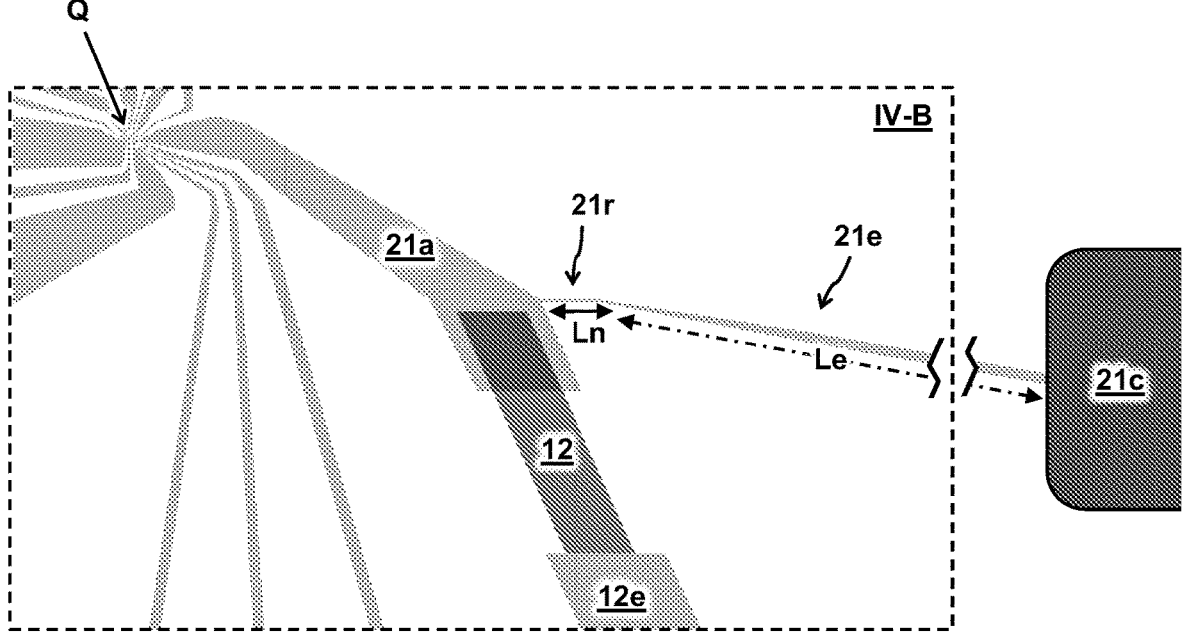
FIG. 4B illustrates part of a zoomed-in area (IV-B in FIG. 4A).

FIG. 4A illustrates an example layout including various connection pads; and FIG. 4B illustrates part of a zoomed-in area (IV-B in FIG. 4A). As illustrated here, the active region of the quantum device or chip, where the gates converge, may be surrounded by a layout of electric pathways connected between the gate pads (not visible here) and respective connection pads that are sufficiently large to connect a respective electrode.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A quantum device comprising:
   a substrate comprising:
      a layered structure forming a quantum well layer at or below an interface of the substrate, and
      a doped region connected to the layered structure for exchanging charge carriers with the quantum well layer; and
   a patterned layer of electrically conductive material forming a set of gates at or above the interface of the substrate,
   wherein the set of gates comprises at least one accumulation gate comprising:
      an accumulation pad configured to accumulate there below a two-dimensional charge carrier gas (2DCCG) in an active region of the quantum well layer connected to the doped region depending on an electric field generated below the accumulation pad,
      a connection pad configured to connect a first electrode to the accumulation gate for setting an accumulation gate voltage to the accumulation pad determining the generated electric field, and an electric pathway between the accumulation pad and the connection pad, wherein at least part of the electric pathway is narrowed to form a nanoscale constriction for cutting off the active region of the quantum well layer below and confining the 2DCCG, below the accumulation pad, to the cut off active region;

wherein the accumulation pad, up to the nanoscale constriction, has a surface area of at least one tenth square micrometer.

2. The quantum device according to claim 1, wherein the nanoscale constriction is integrally formed as part of the patterned layer of electrically conductive material, wherein the accumulation pad, the nanoscale constriction, and any remainder of the electric pathway are formed as part of one layer of the electrically conductive material.

3. The quantum device according to claim 1, wherein the nanoscale constriction lies in a plane with the accumulation pad forming part of the patterned layer.

4. The quantum device according to claim 1, wherein the quantum well layer extends below the electric pathway.

5. The quantum device according to claim 1, wherein the nanoscale constriction, along at least part of the electric pathway between the accumulation pad and connection pad, has a minimum length of at least one micrometer;

wherein, along said the minimum length, the nanoscale constriction has a maximum width, transverse to the length and in plane of the patterned layer, less than one hundred nanometer.

6. The quantum device according to claim 1, wherein a length of the electric pathway between the accumulation pad and connection pad is divided in a first length of the nanoscale constriction and a second length of a rest of the electric pathway;

wherein the second length is longer than the first length by at least a factor of one hundred;

wherein, along said second length, the rest of the electric pathway has a minimum width, transverse to the second length, that is larger than a maximum width of the nanoscale constriction by at least a factor of five.

7. The quantum device according to claim 1, wherein the nanoscale constriction is disposed directly adjacent an area of the accumulation pad, with a rest of the electric pathway between the nanoscale constriction and the connection pad.

8. The quantum device according to claim 1, wherein the accumulation pad up to the nanoscale constriction has a surface area between one tenth square micrometer and ten thousand square micrometer.

9. The quantum device according to claim 1, wherein an electrically insulating layer is disposed at least between the electrically conductive material and the quantum well layer, wherein the accumulation pad overlaps an edge of the doped region there below with the electrically insulating layer there between.

10. The quantum device according to claim 1, wherein at least part of the doped region is exposed to form a galvanic contact for connecting a second electrode with the quantum well layer via the doped region.

11. The quantum device according to claim 1, wherein the set of gates comprises at least one plunger gate with a plunger pad configured to form a quantum dot in the quantum well layer there below, and wherein the plunger pad is disposed adjacent the accumulation pad, and configured to receive a charge carrier in the quantum dot (Q) from an adjacent 2DCCG.

12. The quantum device according to claim 1, wherein the set of gates comprises at least a first accumulation gate and a second accumulation gate, and wherein the first accumulation gate and the second accumulation gate are disposed on opposite sides of a plunger gate, with barrier gates there between.

13. The quantum device according to claim 1, wherein the substrate is a semiconductor substrate, wherein the layered structure comprises a stack of two or more layers of semiconductor materials having different band gaps, wherein the quantum well layer is formed in a layer of the stack having a layer thickness between 5-20 nm, and wherein the quantum well layer has a conduction band lower than surrounding layers, and/or a valence band higher than surrounding layers.

14. The quantum device according to claim 1, comprising a controller connected via a set of electrodes to respective connection pads of the set of gates, wherein the controller is connected via the first electrode to the connection pad of the accumulation gate and configured to apply an accumulation voltage to the accumulation pad for generating the 2DCCG in the quantum well layer there below;

wherein the controller is connected via a second electrode to the doped region and configured to apply a sensing voltage to the doped region connected to the quantum well layer;

wherein the controller is connected via a third electrode to a separate second doped region and configured to measure a sensing current passing through the quantum well layer between the doped region and the separate second doped region.

15. A method for processing a quantum bit, the method comprising providing a quantum device according to claim 1;

applying a first voltage via the first electrode to the connection pad of the accumulation gate for generating a 2DCCG below the accumulation pad; and applying a second voltage via a second electrode connected to the doped region for causing exchange of charge carriers between the doped region and the 2DCCG, wherein one or more of the charge carriers are passed through or adjacent a quantum dot forming the quantum bit.

\*    \*    \*    \*    \*